United States Patent [19]

Kobayashi et al.

[11] Patent Number: 4,813,018
[45] Date of Patent: Mar. 14, 1989

[54] NONVOLATILE SEMICONDUCTOR MEMORY DEVICE

[75] Inventors: Kazuo Kobayashi; Yasushi Terada; Takeshi Nakayama, all of Hyogo, Japan

[73] Assignee: Mitsubishi Denki Kabushiki Kaisha, Tokyo, Japan

[21] Appl. No.: 125,540

[22] Filed: Nov. 25, 1987

[30] Foreign Application Priority Data

Nov. 28, 1986 [JP] Japan ................. 61-284645

[51] Int. Cl.$^4$ ................................. G11C 7/00
[52] U.S. Cl. ................................. 365/185; 365/203; 365/208
[58] Field of Search ............ 365/149, 185, 203, 205, 365/208, 189, 230; 357/23.5

[56] References Cited

U.S. PATENT DOCUMENTS

| | | | |
|---|---|---|---|
| 4,493,056 | 1/1985 | Mao .................... | 365/149 |
| 4,599,706 | 7/1986 | Guterman ............. | 365/185 |
| 4,611,309 | 9/1986 | Chuang et al. ........ | 365/185 |
| 4,658,381 | 4/1987 | Reed et al. ........... | 365/203 |
| 4,725,983 | 2/1988 | Terada .................. | 365/185 |

*Primary Examiner*—James W. Moffitt
*Attorney, Agent, or Firm*—Lowe, Price, Leblanc, Becker & Shur

[57] ABSTRACT

A nonvolatile semiconductor memory device comprises a random access memory (RAM) and an electrically programmable and erasable read only memory (EEPROM). Since a capacitance (106) is formed between a control gate (103) and a drain (102) of a memory transistor, and a source of the memory transistor is rendered to be floating in the RAM write and read operation and in the EEPROM write operation and is supplied with a finite potential in EEPROM read operation, the operation of nonvolatile memory is achieved. A sense amplifier (15, 16) is amplified the potential difference between a bit line (BL) and a control gate line (CGL) is both memory operation and latches the input data in both write operation, such that the potential of the BL and the CGL are determined low or high potential. Besides in the EEPROM write operation, after latching the input data in the sense amplifier, a nonvolatile program is started such that a BL or a CGL is pumped up to program voltage (15-20 V). In the EEPROM read operation, a BL and a CGL are pre-changed in a different potential (BL<CGL) after equalizing in a same potential (BL=CGL), then the source of memory transistor is supplied with a fininte potential. Therefore, when the EEPROM transistor is conductive, is programmed "0", a BL is pre-charged more than a CGL potential (BL>CGL). After that, the sense amplifier is activated and the EEPROM data is read out.

4 Claims, 9 Drawing Sheets

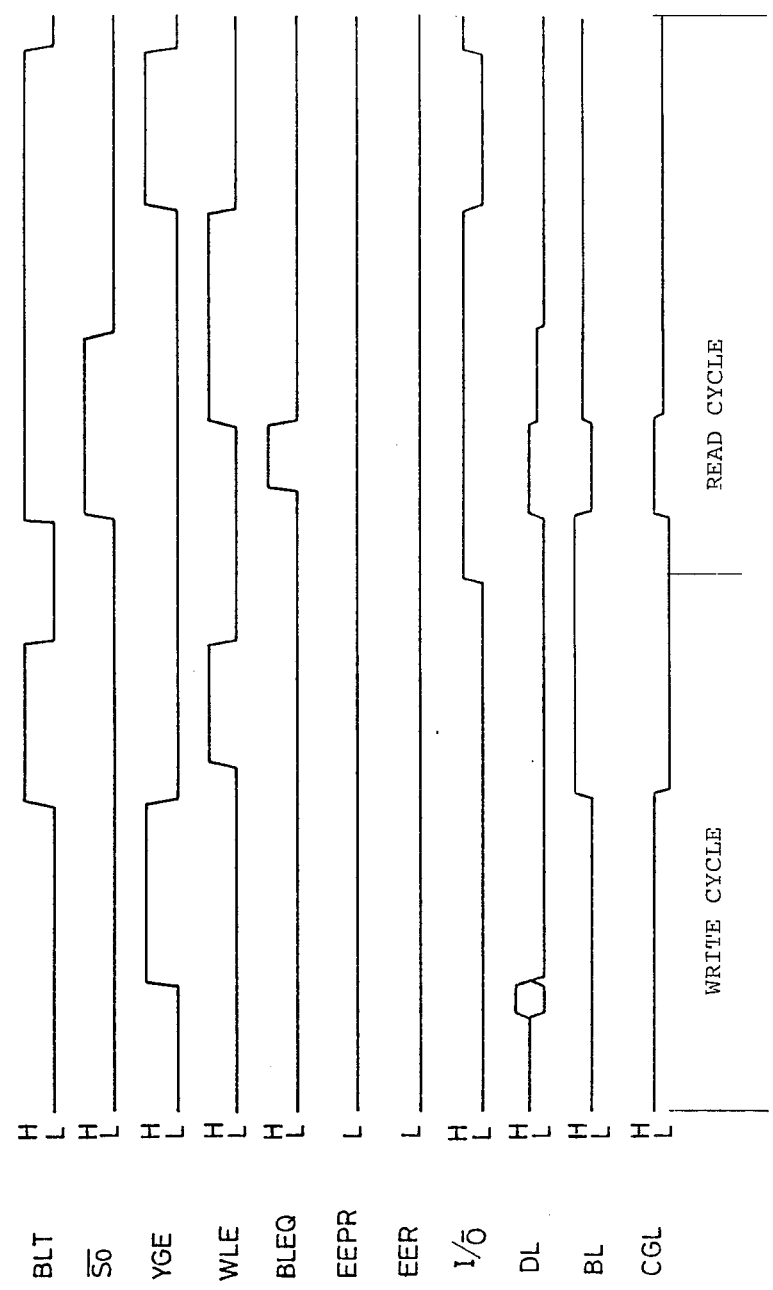

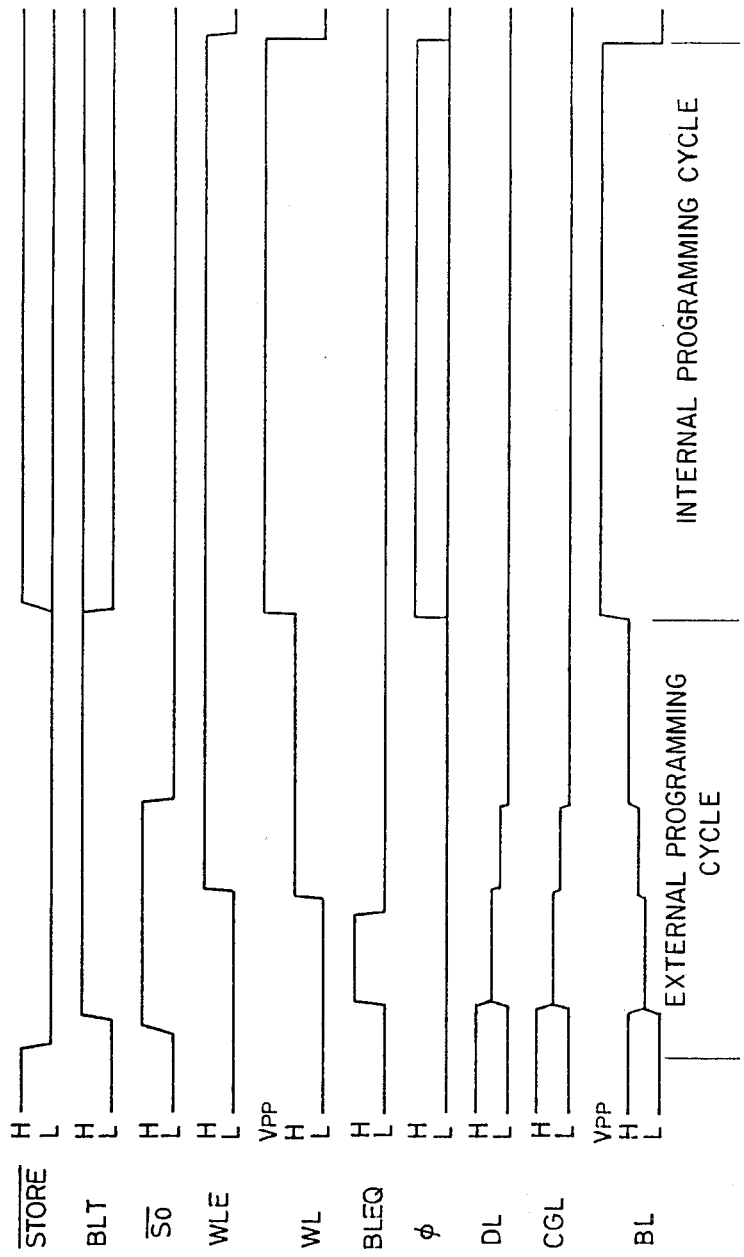

NONVOLATILE SEMICONDUCTOR MEMORY DEVICE

CROSS-REFERENCE TO RELATED, COPENDING APPLICATION

Related, copending application of particular interest to the instant application is U.S. Ser. No. 046,789, entitled "Nonvolatile Semiconductor Memory Device", filed May 7, 1987 now U.S. Pat. No. 4,725,983 and assigned to the same assignee of the instant application.

BACKGROUND OF THE INVENTION

1. Field of the Invention

The present invention relates to a nonvolatile semiconductor memory device and more particularly, to a structure of a memory cell in a nonvolatile random access memory device which can be also used as a dynamic random access memory and an electrically programmable and erasable memory.

2. Description of the Prior Art

An electrically programmable nonvolatile semiconductor memory device includes an EEPROM (electrically erasable and programmable read only memory). The EEPROM has some disadvantages. For example, it requires a data writing time on the order of the millisecond and has a limitation to the number of times of rewriting data. Therefore, a conventional nonvolatile random access memory device (referred to as a nonvolatile RAM hereinafter) is achieved by a combination of a static RAM memory cell in which data can be read and written at the high speed and an EEPROM memory cell in which information can be stored in a nonvolatile manner.

FIG. 1 is a diagram showing an example of a structure of a memory cell in a conventional nonvolatile RAM, which is disclosed in, for example, ISSCC Digest of Technical Papers, February 1983, page 170. In FIG. 1, the memory cell in the conventional nonvolatile RAM comprises a static RAM memory cell portion 1 and an EEPROM memory cell portion 2.

The static RAM cell portion 1 comprises a flip-flop including n channel MOS transistors Q1 to Q4 and transfer gates Q5 and Q6 for transferring data from the flip-flop to a pair of bit lines BL and $\overline{BL}$ or vise versa.

The flip-flop comprises the n channel MOS transistors Q1 and Q2 each having a gate and a drain cross-connected to each other, the transistor Q3 of a depletion type having one conduction terminal connected to a power supply $V_{DD}$ and a gate and other conduction terminal each connected to the gate of the MOS transistor Q2, and the MOS transistor Q4 of a depletion type having one conduction terminal connected to the power supply $V_{DD}$ and a gate and other conduction terminal each connected to the gate of the MOS transistor Q1. The transfer gate Q5 has one conduction terminal connected to the bit line BL, other conduction terminal connected to a node of the MOS transistors Q1 and Q3 and a gate connected to a word line WL. The transfer gate Q6 has one conduction terminal connected to the bit line $\overline{BL}$, other conduction terminal connected to a node of the MOS transistors Q2 and Q4 and a gate connected to the word line WL.

The EEPROM memory cell portion 2 comprises a transfer gate Q8 for transferring data from/to the static RAM cell portion 1, a transistor Q7 of an FLOTOX (floating gate tunnel oxide film) type for storing information in a nonvolatile manner, and a transistor Q9 serving as a source for transferring charges from/to a floating gate of the memory transistor Q7. The transfer gate transistor Q8 has a gate receiving a clock signal CLK for providing timing for transferring data from the static RAM cell portion 1 to the EEPROM cell portion 2 or vice versa. The memory transistor Q7 has a control gate receiving a signal PRO for providing timing for writing and erasing information of the memory transistor Q7. The transistor Q9, which has a diode-connection, has one conduction terminal connected to a drain of the memory transistor Q7 and other conduction terminal connected to a signal CLR for applying a potential to the drain of the memory transistor Q7 at the time of writing and erasing of data. Description is now made on operation.

A memory cell is selected by the word line WL. More specifically, when the potential on the selected word line WL attains an "H" level, the transfer gates Q5 and Q6 are turned on. As a result, outputs of the flip-flop, that is, the drains of the transistors Q1 and Q2 are connected to the bit lines BL and $\overline{BL}$, respectively, so that information is read or written through the bit lines BL and $\overline{BL}$.

Information is stored in a nonvolatile manner in the EEPROM cell portion 2, that is, in the memory transistor Q7 through the transfer gate Q8. Operation of writing, erasing and reading data in the memory transistor Q7 are the same as that in the memory transistor in the conventional EEPROM. More specifically, data written into the static RAM cell portion 1 is stored in a nonvolatile manner by causing the signals CLK, PRO and CLR and the power-supply potential $V_{DD}$ and the memory cell to be a suitable voltage at suitable timing. Operation of transferring information is described in the above described document of the prior art.

As described in the foregoing, since the conventional nonvolatile RAM memory cell is formed by a combination of the static RAM memory cell and the EEPROM memory cell, the number of transistors required for each memory cell is large, so that the area occupied by a memory cell is increased, which presents a large problem in improving integration. In addition, the number of signal lines is large, so that the structure and control operation of a circuit are complicated.

SUMMARY OF THE INVENTION

An object of the present invention is to solve the above described problems and to provide a nonvolatile RAM having a novel structure in which the number of transistors for each memory cell is reduced and the circuit structure is simplified so that the area occupied by a cell can be decreased and control operation can be simplified.

Briefly stated, the present invention is directed to a nonvolatile semiconductor memory device having a plurality of memory cells in which information can be written and erased arranged in a matrix, each of the memory cells comprising three transistors and a single memory transistor and a single capacitance connected between a first electrode and a second electrode of the memory transistor.

Therefore, according to the present invention, the number of transistors required for a single cell can be decreased, the circuit structure can be simplified and the area occupied by the cell can be decreased.

In accordance with another aspect of the present invention, a capacitance is connected between the first electrode and the second electrode of the memory transistor, a first selecting transistor is connected between the first electrode and a column selecting signal line of the memory transistor and a second selecting transistor is connected between the second electrode and the control line of the memory transistor, so that a third electrode of the memory transistor is rendered to be floating, the first and second selecting transistors are rendered conductive, potentials on the column selecting signal line and the control line are applied to the capacitance and then, charges are stored in the capacitance when the first and second selecting transistors are rendered non-conductive.

In accordance with still another aspect of the present invention, the nonvolatile semiconductor memory device comprises column address decoder means for decoding a column address signal externally applied, row address decoder means for decoding a row address signal externally applied, first data line means for transferring input/output data, second data line means for transferring data which is complimentary to the input/output data, means for causing the first and second data lines take the same potential, sense amplifier means for differentially amplifying the difference between potentials on the first and second data lines, means for applying the input/output data to the first and second data lines, charging means for charging in advance the first and second data lines, control line means for applying a control signal to the memory cell, and high voltage applying means for causing the first and second data lines and an output of the row address decoder means to be high potentials, the first and second data lines, the output of the address decoder means and the control signal line being connected to the memory cell.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 5A is a timing chart when the nonvolatile semiconductor memory device according to an embodiment of the present invention is operated as a DRAM, FIG. 6A is a timing chart in store operation according to an embodiment of the present invention.

DESCRIPTION OF THE PREFERRED EMBODIMENTS

Figure 1:
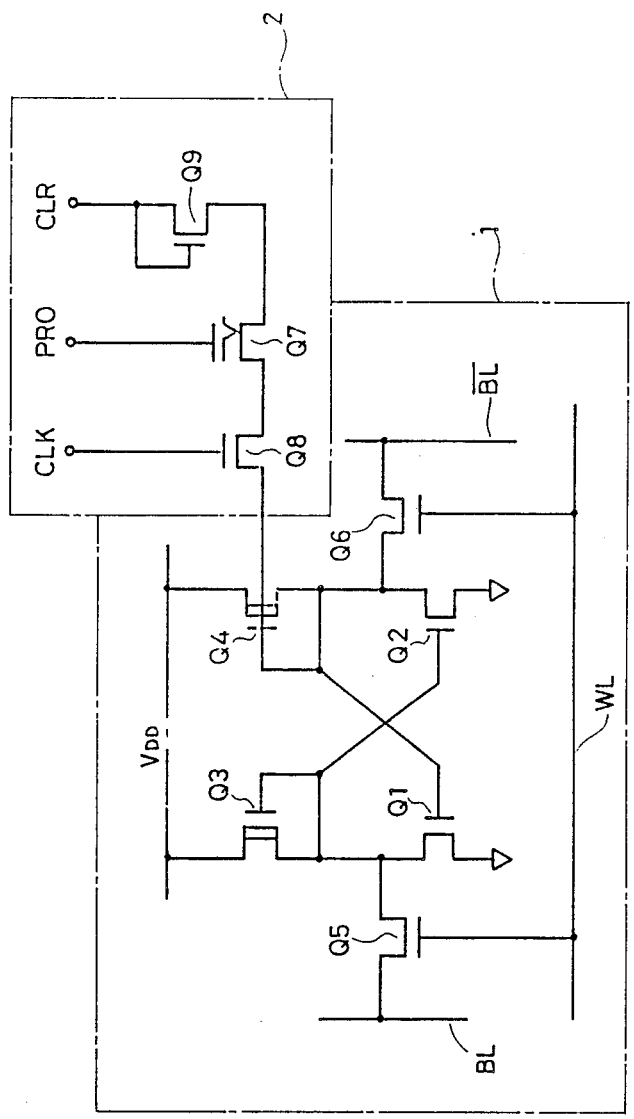
FIG. 1 is a diagram showing a structure of a memory cell in a conventional nonvolatile RAM.
Figure 2:
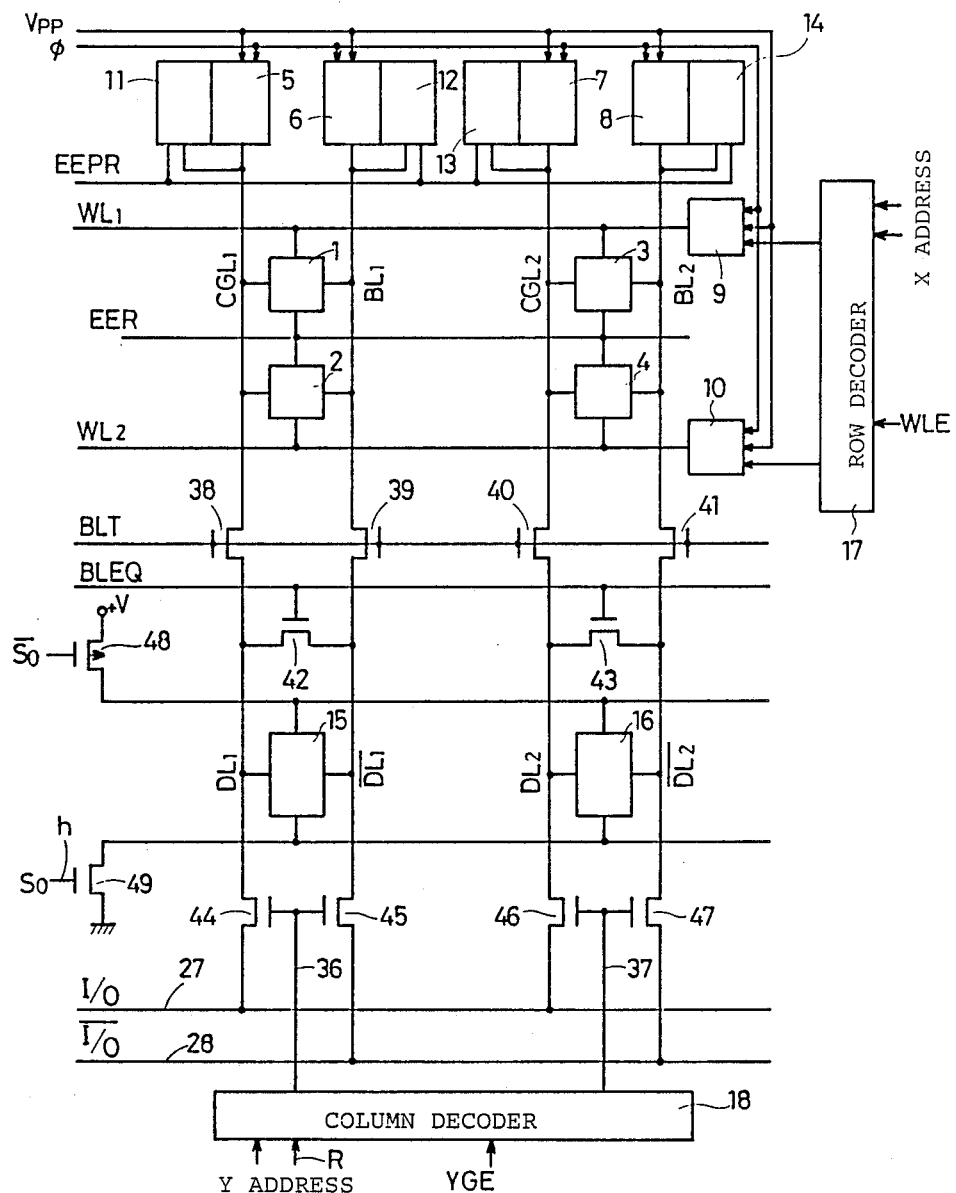
FIG. 2 is an electric circuit diagram of a nonvolatile semiconductor memory device according to an embodiment of the present invention.
Figure 3A:
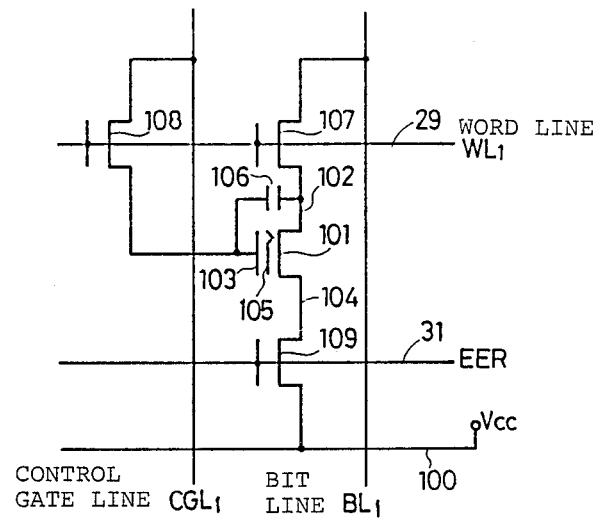
FIGS. 3A and 3B are specific electric circuit diagram of a memory cell shown in FIG. 2.
Figure 3B:
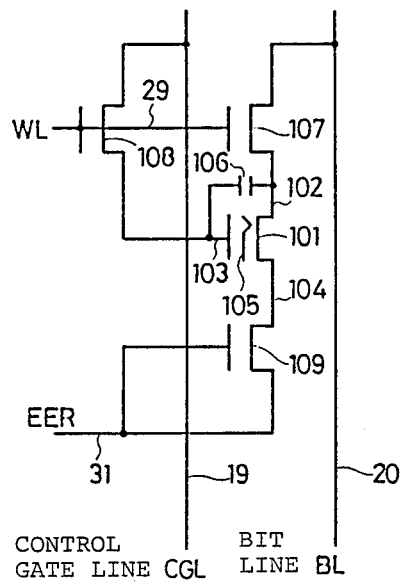
Figure 4:
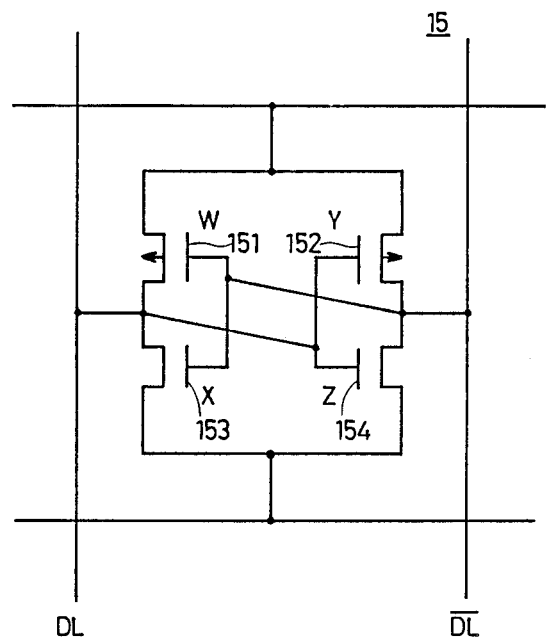
FIG. 4 is a electric circuit diagram of a sense amplifier shown in FIG. 2.

FIG. 2 is an electric circuit diagram of a nonvolatile semiconductor memory device according to an embodiment of the present invention, FIG. 3A is a specific electric circuit diagram of a memory cell shown in FIG. 1, FIG. 3B is an electric circuit diagram showing another example of the memory cell, and FIG. 4 is an electric circuit diagram showing a structure of a sense amplifier shown in FIG. 1.

Referring to FIGS. 2 to 4 description is made on a structure of a nonvolatile semiconductor memory device according to an embodiment of the present invention. In FIG. 2, the nonvolatile semiconductor memory device of a pattern of four bits is illustrated. A control gate line $CGL_1$ and a bit line $BL_1$ are connected to memory cells 1 and 2, and a control gate line $CGL_2$ and a bit line $BL_2$ are connected to memory cell 3. The control gate line $CGL_1$ is connected to a high voltage selecting switch 5, a precharging circuit 11 and a drain of a transistor 38. The bit line $BL_1$ is connected to a high voltage selecting switch 6, a precharging circuit 12 and a drain of a transistor 39.

The control gate line $CGL_2$ is connected to a high voltage selecting switch 7, a precharging circuit 13 and a drain of a transistor 40. The bit line $BL_2$ is connected to a high voltage selecting switch 8, a precharging circuit 14 and a drain of a transistor 41. In addition, a word line $WL_1$ is connected to the memory cells 1 and 3, and a word line $WL_2$ is connected to the memory cells 2 and 4. A high voltage selecting switch 9 is connected to the word line $WL_1$, and a high voltage selecting switch 10 is connected to the word line $WL_2$.

A high voltage $V_{PP}$ and a clock signal $\phi$ are applied to the high voltage selecting switches 5 to 10. Furthermore, a row decode signal is applied from a row decoder 17 to the high voltage selecting switches 9 and 10. X address signals and a row decoder activating signal WLE are applied to the row decoder 17. When the row decoder activating signal WLE is at an "H" level, the row decoder 17 selects the word line $WL_1$ or $WL_2$ by the X address signals.

The above described transistor 38 has a source connected to a data line $DL_1$, the transistor 39 has a source connected to a data line $\overline{DL_1}$, the transistor 40 has a source connected to a data line $DL_2$ and the transistor 41 has a source connected to a data line $\overline{DL_2}$. Each of the transistors 38 to 41 has a gate receiving a BLT signal. The transistor 38 is rendered conductive in response to the BLT signal to connect the control gate line $CGL_1$ and the data line $DL_1$. The transistor 39 is rendered conductive in response to the BLT signal to connect the bit line $EL_1$ and the data line $\overline{DL_1}$. A transistor 40 is rendered conductive in response to the BLT signal to connect the control gate line $CGL_2$ and the data line $DL_2$. The transistor 41 connects the bit line $BL_2$ and the data line $\overline{DL_2}$.

A transistor 42 is connected between the data lines $DL_1$ and $\overline{DL_1}$. The transistor 42 has a gate receiving an equalize signal BLEQ. The transistor 42 is rendered conductive in response to the equalize signal BLEQ, so that the data lines $DL_1$ and $\overline{DL_1}$ are made to be a common potential. In addition, a transistor 43 is connected between the data lines $DL_2$ and $\overline{DL_2}$. The transistor 43 has a gate receiving the equalize signal BLEQ. The transistor 43 is rendered conductive in response to the BLEQ signal, so that the data lines $DL_2$ and $\overline{DL_2}$ are made to be a common potential.

A sense amplifier 15 is connected between the data lines $DL_1$ and $\overline{DL_2}$, and a sense amplifier 16 is connected between the data lines $DL_2$ and $\overline{DL_2}$. The sense amplifier 15 amplifies the potential difference between data lines $DL_1$ and $\overline{DL_1}$, and the sense amplifier 16 amplifies the potential difference between the data lines $DL_2$ and $\overline{DL_2}$. The sense amplifiers 15 and 16 are activated by transistors 48 and 49 which are rendered conductive in response to sense amplifier activating signals $S_O$ and $\overline{S_O}$. The sense amplifiers 15 and 16 comprises transistors 151 to 154, as shown in FIG. 4.

The data line $DL_1$ is further connected to a drain of a transistor 44, the data line $\overline{DL_1}$ is connected to a drain of a transistor 45, the data line $DL_2$ is connected to a drain of a transistor 46, and the data line $\overline{DL_2}$ is connected to a drain of a transistor 47. Each of the transistors 44 and 46 has a source connected to an I/O line 27. Each of the transistors 45 and 47 has a source connected to an $\overline{I}$/ line 28.

Each of the transistors 44 and 45 has a gate receiving a column decode signal 36 from a column decoder 18. Each of the transistors 46 and 47 has a gate receiving a column decode signal 37. A column decoder activating signal YGE is applied to the column decoder 18. The column decoder 18 is responsive to the column decoder activating signal YGE and Y address signals for outputting the column decode signal 36 or 37. When the column decoder 18 outputs the column decode signal 36, the transistors 44 and 45 are rendered conductive, so that the data line $DL_1$ is connected to the I/O line 27 and the data line $\overline{DL_1}$ is connected to the $\overline{I}$/ line 28. In addition, when the column decode signal 37 is outputted, the transistors 46 and 47 are rendered conductive, respectively, so that the data line $DL_2$ is connected to the I/O line 27 and the data line $\overline{DL_2}$ connected to the $\overline{I}$/ line 28.

Referring to FIG. 3A, description is made on a structure of each of the memory cells 1 to 4. An EEPROM memory transistor 101 comprises a drain 102, a control gate 103, a source 104 and a floating gate 105. A capacitance 106 is connected between the drain 102 and the control gate 103 of the EEPROM memory transistor 101. The capacitance 106 is a memory cell of an RAM. In addition, the drain 102 of the EEPROM memory transistor 101 is connected to a source of a selecting transistor 107. The control gate 103 of the EEPROM memory transistor 101 is connected to a source of a selecting transistor 108.

Each of the selecting transistors 107 and 108 has a gate connected to a word line $WL_1$. The selecting transistor 107 has a drain connected to a bit line $BL_1$. The selecting transistor 108 has a drain connected to a control gate line $CGL_1$. In addition, the source 104 of the EEPROM memory transistor 101 is connected to a drain of a source line transistor 109. The source line transistor 109 supplies current from a power supply line 100 to the source 104 when data stored in the EEPROM memory transistor 101 is read out.

The structure of a memory cell shown in FIG. 3B is the same as that shown in FIG. 3A except that a source line transistor 109 has a gate and a source connected in common and receiving an EER signal.

Figure 5B:
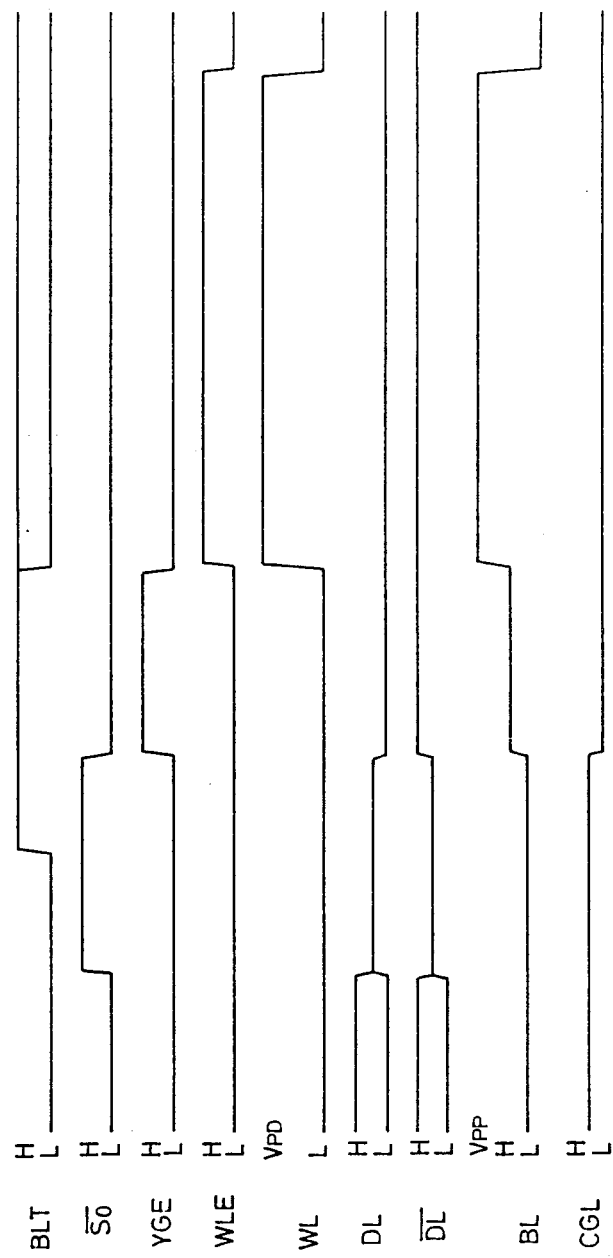
FIG. 5B is a timing chart in write operation of an EEPROM.
Figure 5C:
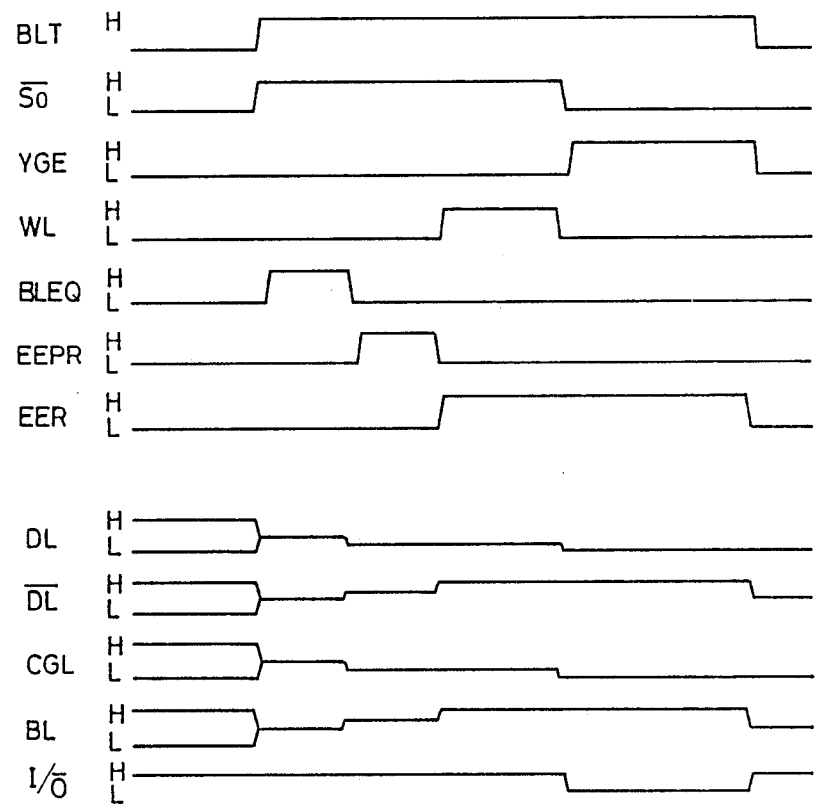
FIG. 5C is a timing chart in read operation of the EEPROM.

FIG. 5A is a timing chart when the nonvolatile semiconductor memory device according to an embodiment of the present invention is operated as a DRAM, FIG. 5B is a timing chart in write operation of an EEPROM and FIG. 5C is a timing chart in read operation of the EEPROM.

Referring now to FIGS. 2 to 5C, description is made on specific operation according to an embodiment of the present invention. Ordinary DRAM operation is now described. At the time of DRAM operation, the EER signal is at an "L" level and the source of the EEPROM memory transistor 101 is rendered to be electrically floating, so that data is stored in the capacitance 106 selected by the selecting transistors 107 and 108.

Description is now made on the case in which data "0" is written into the memory cell 1. Writing of data is started when a write enable ($\overline{WE}$) signal (not shown) attains the "L" level. As a result, the column decoder activating signal YGE attains an "H" level, so that the Y gate transistors 44 and 45 in selected columns are rendered conductive. At the time of writing data "0", since the I/O line 27 is at the "L" level and the $\overline{I}$/ line 28 is at the "H" level, the data line $DL_1$ attains the "L" level and the data line $\overline{DL_1}$ attains the "H" level. At that time, the transistors 38 and 39 are rendered non-conductive because the BLT signal is at the "L" level. In addition, the sense amplifier activating signal $\overline{S_O}$ is at the "L" level, so that the sense amplifier 15 is rendered active. Therefore, input data is immediately latched in the sense amplifier 15.

Then, the column decoder activating signal YGE attains the "L" level and the BLT signal attains the "H" level. The control gate line $CGL_1$ and the bit line $BL_1$ are charged or discharged to be the "L" level and the "H" level, respectively, by the sense amplifier 15. When the row decoder activating signal WLE attains the "H" level, the row decoder 17 selects the word line $WL_1$. Thus, the drain 102 of the EEPROM memory transistor 101 attains the "H" level and the gate 103 thereof is charged to be the "L" level, so that data is stored in the capacitance 106. When the input data is "1", the same operation is performed. The following description is made on the case in which data "0" is written or read out by way of example.

Reading of data "0" in the same DRAM operation is now described. When an $\overline{OE}$ signal (not shown) attains the "L" level and the BLT signal attains the "H" level so that the transistors 38 to 41 are rendered conductive, the control gate line $CGL_1$ and the data line $DL_1$, the bit line $BL_1$ and the data line $\overline{DL_1}$, the control gate line $CGL_2$ and the data line $DL_2$ and the bit line $DL_2$ and the data line $\overline{DL_2}$ are connected to each other, respectively. The sense amplifier activating signal $\overline{S_O}$ attains the "H" level, so that the sense amplifier activating signal $\overline{S_O}$ is rendered inactive.

When the equalize signal BLEQ attains the "H" level so that the transistors 42 and 43 are rendered conductive, the control gate line $CGL_1$ and the data line $DL_1$, the bit line $BL_1$ and the data line $\overline{DL_1}$, the control gate line $CGL_2$ and the data line $DL_2$ and the bit line $BL_2$ and the data line $\overline{DL_2}$ are equalized to be the same potential, respectively. The equalize signal BLEQ attains the "L" level and the row decoder activating signal WLE attains the "H" level. As a result, the row decoder 17 selects the word line $WL_1$ and causes the same to be "H" level, and the drain 102 and the control gate 103 of the EEPROM memory transistor in the memory cell are connected to the bit line $BL_1$ and the control gate line $CGL_1$, respectively, so that there occurs a slight potential difference therebetween.

Thereafter, the sense amplifier activating signal $\overline{S_O}$ is made to be the "L" level, so that the sense amplifier 15 is rendered active and the potential difference between the data lines $DL_1$ and $\overline{DL_1}$ is amplified. Thus, data stored in the capacitance 106 is stored in the sense amplifier 15. In addition, the bit line $BL_1$ and the control gate line $CGL_1$ attains the "H" level and the "L" level, respectively, so that the data is rewritten again into the capacitance 106. Thereafter, the row decoder activating signal WLE is made to be the "L" level and then, the column decoder activating signal YGE is made to be the "H" level, so that the Y gate transistors 44 and 45 are rendered conductive. As a result, the data are read out from the I/O line 27 and the $\overline{I/O}$ line 28.

Description is now made on operation in an EEPROM mode. A mode switching signal is set to be, for example, the "L" level, so that the mode switching signal enters the EEPROM mode. Write operation is now described. Operation in the EEPROM mode is the same as that of the above described DRAM mode until input data is latched in the sense amplifier 15. Thereafter, the data latched in the sense amplifier 15 is written into the EEPROM memory transistor 101 in the memory cell 1 in a nonvolatile manner, which is referred to as an internal programming cycle hereinafter. The column decoder activating signal YGE attains the "L" level and then, the Y decode signal 36 attains the "L" level, so that the transistors 44 and 45 are rendered non-conductive. When the row decoder activating signal WLE attains the "H" level, the word line $WL_1$ attains the "H" level.

On the other hand, when the internal programming cycle is started, a high voltage, programming pulse $V_{PP}$ for writing in a nonvolatile manner takes a value of approximately 15 to 20 V by a charge pump (not shown). However, the value is 0 V in a cycle other than the internal programming cycle.

Furthermore, in order to activate the high voltage selecting switches 5 to 10 provided in the bit lines $BL_1$ and $BL_2$, the control gate lines $CGL_1$ and $CGL_2$ and the word lines $WL_1$ and $WL_2$, a clock signal $\phi$ having an oscillation frequency of approximately 5 to 10 MHz oscillates from an oscillator (not shown) during the internal programming cycle. Thus, the word line $WL_1$ selected by the high voltage selecting switches 5 to 10 rises to the value of the high voltage $V_{PP}$. In addition, when input data is "0", for example, the bit line $BL_1$ is at the "H" level and the control gate line $CGL_1$ is at the "L" level, so that the bit line $BL_1$ rises to the value of the high voltage $V_{PP}$ by the high voltage selecting switch 5 and the control gate line $CGL_1$ remains 0 V.

More specifically, the high voltage $V_{PP}$ is applied to the drain of the EEPROM memory transistor 101, electrons are emitted from the floating gate 105, and a threshold voltage Vth of the EEPROM memory transistor 101 is shifted in the relative direction, so that data "0" is written. In the same manner, at the time of writing data "1", the control gate line $CGL_1$ rises to the value of the high voltage $V_{PP}$, the potential on the bit line $BL_1$ becomes 0 V, electrons are injected into the floating gate 105 and the threshold voltage of the EEPROM memory transistor 101 is shifted in the positive direction.

Referring to FIG. 5C, description is made on read operation of the EEPROM. An $\overline{OE}$ signal (not shown) falls, so that an EER signal attains the "H" level and the source 104 of the EEPROM memory transistor 101 is charged to be the power-supply voltage $V_{CC}$ level. On the other hand, when the $\overline{OE}$ signal falls, the equalize signal BLEQ attains the "H" level, so that the bit line $BL_1$ and the data line $\overline{DL_1}$ and the control gate line $CGL_1$ and the data line $DL_1$ are equalized to be the same potential, respectively.

The precharging circuits 11 to 14 are responsive to a precharging signal EEPR for charging the control gate line $CGL_1$ and the data line $DL_1$ and the bit line $BL_1$ and the data line $\overline{DL_1}$, respectively. When the row decoder activating signal WLE is made to be the "H" level, the row decoder 17 causes the word line $WL_1$ to be the "H" level. In addition, when the threshold voltage Vth of the EEPROM memory transistor 101 is negative, the EEPROM memory transistor 101 is rendered conductive by the potential on the precharged control gate line $CGL_1$, so that the bit line $BL_1$ and the data line $DL_1$ are further charged to be more than the level of the control gate line $CGL_1$. For example, when the control gate line $CGL_1$ is 3 V and the threshold voltage Vth of the EEPROM memory transistor 101 is $-1$ V, the potential on the bit line $BL_1$ becomes 4 V. On the other hand, when the threshold voltage Vth of the EEPROM memory transistor 101 is positive, the EEPROM memory transistor 101 is not rendered conductive, so that the bit line $BL_1$ and the data line $\overline{DL_1}$ are not charged and remain at a precharged level.

Thus, when the data "1" which has been written into the EEPROM memory transistor 101 is read out by the sense amplifier 15, the difference must be made between the precharged levels so that the potentials on the bit line $BL_1$ and the data line $\overline{DL_1}$ are at least smaller than those on the control gate line $CGL_1$ and the data line $DL_1$. More specifically, in order to cause the word line $WL_1$ to be the "H" level and the sense amplifier 15 on the most suitable condition, it is necessary to set the precharged levels of the control gate line $CGL_1$ and the data line $DL_1$ and the bit line $BL_1$ and the data line $\overline{DL_1}$ such that the level of the control gate line $CGL_1$ and the data line $DL_1$ at the time of sense operation is intermediate between the level at the time of writing data "0" and a level at the time of writing data "1" of each of the bit line $BL_1$ and the data line $\overline{DL_1}$ at the time of sense operation.

Figure 6B:
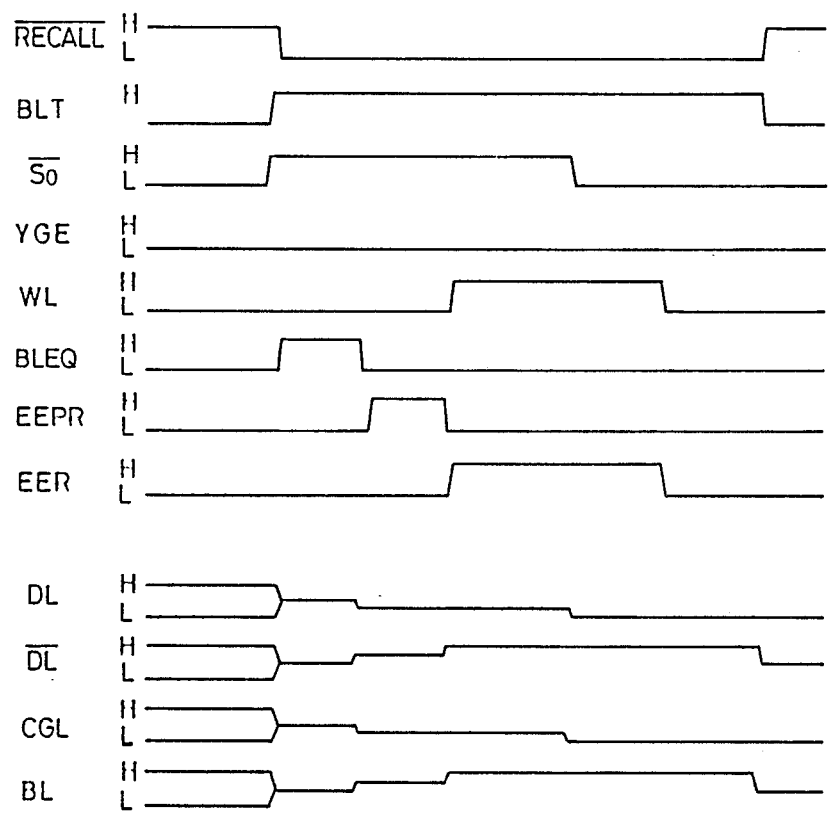
FIG. 6B is a timing chart in recall operation.

Additionally, as another example, information stored in a DRAM can be easily transferred to the EEPROM memory transistor or information stored in the EEPROM memory transistor can be easily transferred to the DRAM. Referring to FIGS. 6A and 6B, the operation is described.

Referring to FIG. 6A, description is made on store operation in which data of the DRAM is written into the EEPROM. A $\overline{STORE}$ signal attains the "L" level and the BLT signal attains the "H" level as shown in FIG. 6A, so that the control gate line $CGL_1$ and the data line $DL_1$ and the bit line $BL_1$ and the data line $\overline{DL_1}$ connected to each other, respectively. In addition, the sense amplifier activating signal $\overline{S_O}$ also attains the "H" level, so that the sense amplifiers 15 and 16 are rendered inactive, respectively. Then, the equalize signal BLEQ attains the "H" level, so that the transistor 42 is rendered conductive. As a result, the control gate line $CGL_1$ and the data line $DL_1$ and the bit line $BL_1$ and the data line $\overline{DL_1}$ are made to be the same potential, respectively.

Then, when the row decoder activating signal WLE attains the "H" level, the row decoder 17 causes the word line $WL_1$ to be the "H" level. Therefore, data stored in the capacitance 106 is read out. More specifically, at the time of writing data "0", the potentials on the bit line $BL_1$ and the data line $\overline{DL_1}$ are slightly higher than those the control gate line $CGL_1$ and the data line $DL_1$. When the sense amplifier activating signal $\overline{S_O}$ attains the "L" level, the sense amplifier 15 is activated, so that the potential difference between the data lines $DL_1$ and $\overline{DL_1}$ is amplified. As a result, the bit line $BL_1$, the data line $\overline{DL_1}$ and the drain of the EEPROM memory transistor 101 attain the "H" level, and the control gate line CGL₁, the data line DL₁ and the control gate 103 of the memory transistor 101 attain the "L" level.

Thereafter, the next nonvolatile write cycle is started, which is referred to as an external cycle hereinafter. The cycle for writing data into the EEPROM memory transistor 101 is referred to as an internal cycle. A high-frequency oscillator (not shown) operates, the clock pulse $\phi$ is outputted and a charge pump (not shown) for generating a high voltage is driven. At the same time, the high voltage selecting switches 6 and 9 are selected, so that the respective outputs rise to the high voltage $V_{PP}$. Thus, the bit line BL₁ and the word line WL₁ are boosted to the high voltage $V_{PP}$, electrons are emitted from the floating gate 105 of the EEPROM memory transistor 101, and the threshold voltage Vth of the EEPROM memory transistor 101 is shifted in the negative direction so that writing of data "0" in a nonvolatile manner is completed.

Referring now to FIG. 6B, description is made on recall operation for writing data stored in the EEPROM memory transistor 101 into a cell of the DRAM. An $\overline{RECALL}$ signal attains the "L" level and the BLT signal attains the "H" level as shown in FIG. 6B, so that the control gate line CGL₁ and the data line DL₁ and the bit line BL₁ and the data line $\overline{BL_1}$ are connected to each other, respectively. In addition, the sense amplifier activating signal $\overline{S_O}$ attains the "H" level, so that the sense amplifier 15 is rendered inactive. Furthermore, the equalize signal BLEQ attains the "H" level, so that the control gate line CGL₁ and the data line DL₁ and the bit line BL₁ and the data line $\overline{BL_1}$ are equalized to be the same potential, respectively.

Then, the equalize signal BLEQ attains the "L" level and the precharging signal EEPR attains the "H" level, so that the control gate line CGL and the data line DL₁ and the bit line BL₁ and the data line $\overline{DL_1}$ charged to be a particular potential, respectively, by the precharging circuits 11 and 12. When the precharging signal EEPR falls, the EEPR signal attains "H" level, so that the transistor 109 in the memory cell 1 is rendered conductive. As a result, a power-supply voltage $V_{CC}$ is applied to the source 104 of the EEPROM memory transistor 101. Thus, when the threshold voltage Vth of the EEPROM memory transistor 101 is negative (data "0" is written), the bit line BL₁ is charged to be near the power-supply voltage $V_{CC}$ by the voltage $V_{CC}$ of the source 104 of the EEPROM memory transistor 101.

Furthermore, when the threshold voltage Vth of the EEPROM memory transistor 101 is positive (data "1" is written), the EEPROM memory transistor 101 is not rendered conductive, so that the bit line BL₁ remains at the precharged level. More specifically, in order to correctly read out data stored in the EEPROM memory transistor 101, the precharged level of the control gate line CGL₁ must be set to be higher than the precharged level of the bit line BL₁ and smaller than the power-supply voltage $V_{CC}$. Then, the sense amplifier activating signal $\overline{S_O}$ made to be the "L" level and the sense amplifier 15 is rendered active, so that the potential differences between the control gate line CGL₁ and the data line DL₁ and the bit line BL₁ and the data line $\overline{DL_1}$ are completely amplified to be L/H. Therefore, data stored in the EEPROM 101 is correctly stored in the capacitance 106.

As described in the foregoing, according to an embodiment of the present invention, the nonvolatile semiconductor memory device is adopted such that a capacitance is formed between a control gate and a drain of a nonvolatile memory transistor, the potential difference between a bit line and a control gate line is differentially amplified, the bit line and the control gate line are charged in advance to be different levels when the nonvolatile memory transistor is read out, the bit line is further charged by the potential applied to a source when the memory transistor is of a depletion type, and data is latched by a sense amplifier at the time of writing. Therefore, a nonvolatile random access memory device with high integration can be obtained. In addition, since high voltages are separately applied to the bit line and the control gate line the time for writing data in a nonvolatile manner can be reduced to half, as compared with the conventional time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device having a plurality of memory cells (1–4) arranged in a matrix of rows and columns and each connected to a row selecting signal line (WL₁) and a bit line (BL₁) in which information can be electrically written and erased, each of said memory cells comprising
    a memory transistor (101) having a first electrode (102), a second electrode (103) and a third electrode (104),
    a capacitance (106) connected between the first electrode and the second electrode of said memory transistor,
    a first row selecting transistor (107) connected between the first electrode of said memory transistor and said bit line,
    a control gate line (CGL₁) for applying a control gate signal to the second electrode of said memory transistor, and
    a second row selecting transistor (108) connected between the second electrode of said memory transistor and said control gate line,
    a control transistor (109) connected to the third electrode of said memory transistor, and
    means (EER) for rendering said control transistor non-conductive and rendering the third electrode of said memory transistor to be floating.

2. A nonvolatile semiconductor memory device having a plurality of memory cells in which information can be electrically written and erased arranged in a matrix, comprising
    column address decoder means (18) for decoding a column address signal externally applied,
    row address decoder means (17) for decoding a row address signal externally applied,
    a first data line (DL₁) for transferring input/output data,
    a second data line (DL₁) for transferring data which is complementary to said input/output data,
    means (42, 43) for causing said first and second data lines to be the same potential,
    sense amplifier means (15, 16) for differentially amplifying the potential difference between said first and second data lines,
    means (44–47) for applying said input/output data to said first and second data lines,
    charging means (11–14) for charging in advance said first and second data lines, a control signal line (EER) for applying a control signal to said memory cells, and high voltage applying means (5–10) for causing said first and second data lines and an output of said row address decoder means to be a high potential, said memory cell being connected to said first and second data lines, the output of said row address decoder means and said control signal line.

3. A nonvolatile semiconductor memory device according to claim 2, which further comprises means for charging said first and second data lines in advance to be different potentials and applying a potential to the third electrode of said nonvolatile memory transistor when information stored in said nonvolatile memory transistor is read out.

4. A nonvolatile semiconductor memory device according to claim 2, wherein said sense amplifier means comprises means for latching input data at the time of non-volatile programming.

* * * * *